(12) United States Patent
O'Brien et al.

(10) Patent No.: US 8,260,473 B1
(45) Date of Patent: Sep. 4, 2012

(54) MANAGING THE OPERATION OF A SEMICONDUCTOR DEVICE UNDER VARYING LOAD CONDITIONS

(75) Inventors: Thomas Daniel O'Brien, Honeoye Falls, NY (US); Mark David Rodzinka, Farmington, NY (US); Joseph Gerard Trabold, Rochester, NY (US)

(73) Assignee: L-3 Services, Inc., San Diego, CA (US)

( * ) Notice: Subject to any disclaimer, the term of this patent is extended or adjusted under 35 U.S.C. 154(b) by 305 days.

(21) Appl. No.: 12/758,225

(22) Filed: Apr. 12, 2010

(51) Int. Cl.
*G05D 23/00* (2006.01)
*G06F 1/00* (2006.01)
(52) U.S. Cl. ........................ 700/299; 713/323
(58) Field of Classification Search .............. 700/22, 700/299; 713/320, 323
See application file for complete search history.

(56) References Cited

U.S. PATENT DOCUMENTS

| | | | |
|---|---|---|---|
| 7,416,332 B2 | 8/2008 | Rountree et al. | |
| 7,467,318 B2* | 12/2008 | Bruno et al. | 713/500 |
| 7,721,128 B2* | 5/2010 | Johns et al. | 713/322 |

* cited by examiner

*Primary Examiner* — Ryan Jarrett
(74) *Attorney, Agent, or Firm* — Edward W. Callan

(57) ABSTRACT

A system for managing the operation of a semiconductor device in accordance with varying load conditions that affect the power being dissipated by the semiconductor device, includes a sensor for measuring a temperature related to the junction temperature of an operating semiconductor device; electronic components for measuring the real-time operating load conditions of the operating semiconductor device; and a computer that is adapted by computer executable program instructions to perform the steps of:

(a) determining the power being dissipated by the operating semiconductor device in accordance with the measured real-time operating load conditions of the semiconductor device;

(b) determining a dynamic temperature cutback threshold for the operating semiconductor device in accordance with the determination of the power being dissipated; and (c) managing the operation of the semiconductor device in accordance with the measured temperature and the dynamic temperature cutback threshold.

12 Claims, 6 Drawing Sheets

MANAGING THE OPERATION OF A SEMICONDUCTOR DEVICE UNDER VARYING LOAD CONDITIONS

BACKGROUND OF THE INVENTION

The present invention pertains to managing the operation of a semiconductor device under varying load conditions that affect the power being dissipated by the semiconductor device.

The power dissipated by a semiconductor device is dissipated as heat, which causes the temperature of the semiconductor device to rise. After prolonged continuous usage, the temperature of an operating semiconductor device, such as a power amplifier, may rise to such an extent that the semiconductor device overheats and fails. In order to prevent such failure, the operation of the semiconductor device is managed by determining the junction temperature of the semiconductor device and cutting back or interrupting the operation of the semiconductor device when the junction temperature reaches a specified maximum attainable junction temperature ($T_{JMAX}$) for the semiconductor device. The junction temperature is the temperature at the junction of the output transistor of the semiconductor device.

Typically a temperature related to the junction temperature of the semiconductor device is measured by a temperature sensor disposed on the case of the semiconductor device. While such a measurement provides an approximate measurement of the junction temperature, the difference between the temperature of the case at the location of the temperature sensor and the actual junction temperature varies under varying operating conditions of the semiconductor device because such difference is affected by the power dissipation of the semiconductor device.

For semiconductor devices, such as radio frequency (RF) power amplifiers that experience varying load (antenna) conditions, it is desirable to use a semiconductor device that has a specified maximum attainable junction temperature ($T_{JMAX}$) that guarantees safe operating temperatures for high power-dissipation loads. However, because $T_{JMAX}$ is specified as an absolute maximum by the semiconductor manufacturer, the sensor temperature cutback threshold ($T_{CB}$) must be overly conservative to account for the worst case power dissipation conditions which vary as the load changes for static thermal management implementations.

Also, since power dissipation is estimated to be the difference between the power supplied to the semiconductor device and the power delivered by the semiconductor device to the load, it is difficult to quantify power dissipation for non-sinusoidal time-varying signals, modulated signals, and loads that cause reflected power at high frequencies.

SUMMARY OF THE INVENTION

The present invention provides a method of managing the operation of a semiconductor device in accordance with varying load conditions that affect the power being dissipated by the semiconductor device, comprising the steps of:

(a) measuring a temperature related to the junction temperature of an operating semiconductor device;

(b) measuring the real-time operating load conditions of the operating semiconductor device;

(c) determining the power being dissipated by the operating semiconductor device in accordance with the measured real-time operating load conditions of the semiconductor device;

(d) determining a dynamic temperature cutback threshold for the operating semiconductor device in accordance with the determination of the power being dissipated; and (e) managing the operation of the semiconductor device in accordance with the measured temperature and the dynamic temperature cutback threshold.

The present invention additionally provides a system for performing the above-described method and computer readable storage media including computer executable program instructions for causing one or more computers to perform and/or enable the steps of the respective above-described method.

Additional features of the present invention are described with reference to the detailed description of the preferred embodiments.

DETAILED DESCRIPTION

Figure 1:
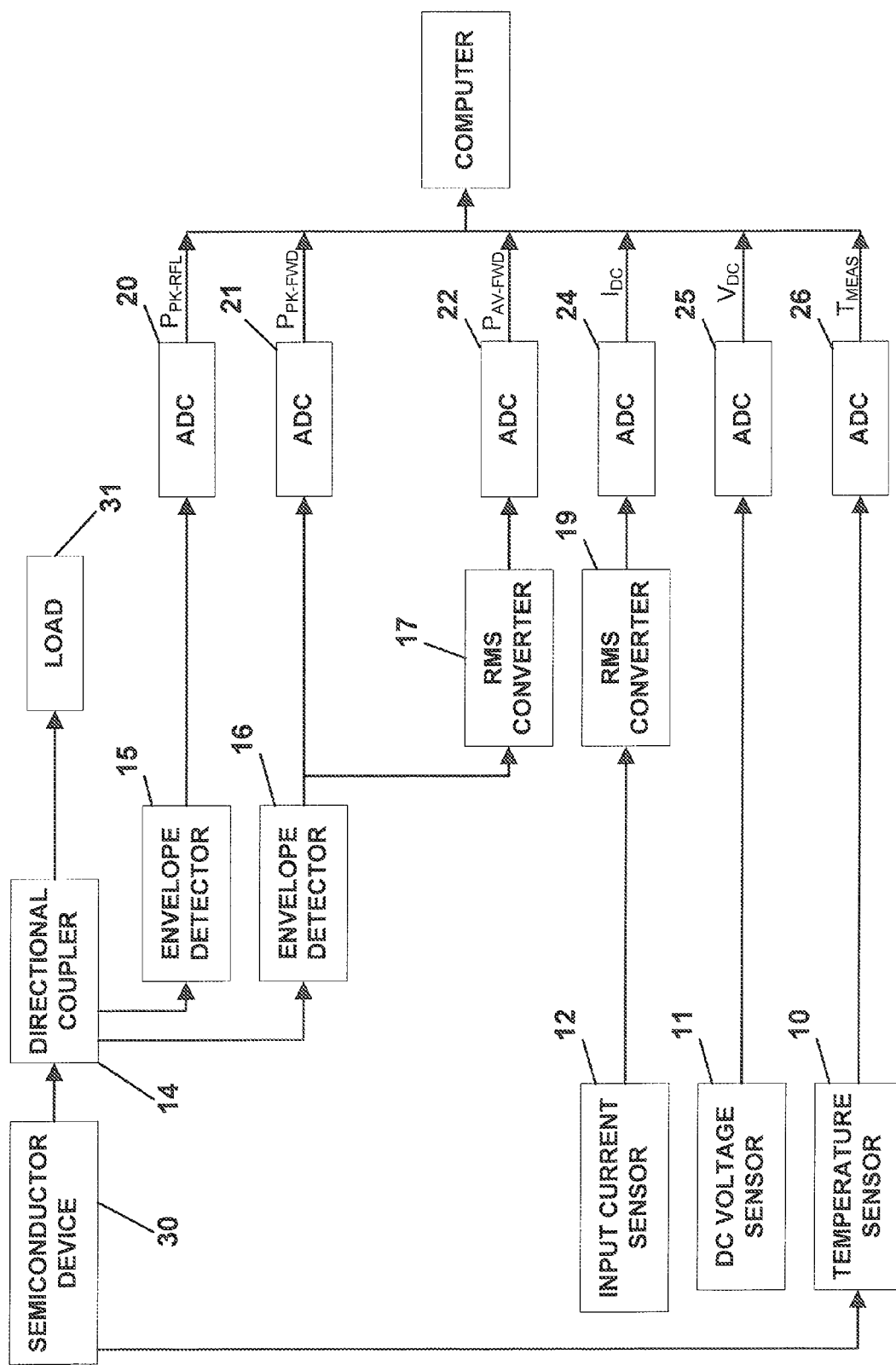
FIG. 1 is a block diagram of an exemplary embodiment of a system according to the present invention for managing the operation of a semiconductor device in accordance with varying load conditions.

Referring to FIG. 1, an exemplary embodiment of a system according to the present invention includes a temperature sensor 10, a DC voltage sensor 11, an input current sensor 12, a directional coupler 14, a first envelope detector 15, a second envelope detector 16, a first RMS converter 17, a second RMS converter 19, a set of analog-to-digital converters (ADC) 20, 21, 22, 24, 25, 26 and a computer 27. This exemplary embodiment manages the operation of a semiconductor device 30, such as an RF power amplifier, that is providing power to a load 31, such as an antenna.

The temperature sensor 10 is coupled to the case of the semiconductor device 30 for measuring a temperature related to the junction temperature of the semiconductor device 30. In some embodiments, the temperature sensor 10 is mounted on the case of semiconductor device. In other embodiments the temperature sensor 10 is mounted adjacent the case of the semiconductor device 30 on a common heatsink.

The DC voltage sensor 11 and the input current sensor 12 are coupled to a circuit that supplies power to the semiconductor device 30.

The directional coupler 14 is connected between the output of the semiconductor device 30 and the input of the load 31 for providing scaled samples of the forward and reflected power.

The first envelope detector 15 is coupled between the output of the directional coupler 14 and the input of the load 31 for measuring the peak power reflected back to the semiconductor device 30 from the load 31.

The second envelope detector 16 is coupled between the output of the directional coupler 14 and the input of the load 31 for measuring the peak forward power from the semiconductor device 30 to the load 31.

The first RMS converter 17 is coupled to the output of the second peak power detector 16 for measuring the average forward power from the semiconductor device 30 to the load 31. Some of the available integrated circuit technologies enable the peak forward power and average forward power measurements to be combined into one function.

The second RMS converter 19 is coupled to the output of the input current sensor 12 for measuring the RMS current supplied to the semiconductor device 30.

A first ADC 20 is connected to the first envelope detector 15 for converting an analog output signal from the first envelope detector 15 to a digital signal $P_{PK-RFL}$ representative of the peak power reflected back to the semiconductor device 30 from the load 31.

A second ADC 21 is connected to the second envelope detector 16 for converting an analog output signal from the second envelope detector 16 to a digital signal $P_{PK-FWD}$ representative of the peak forward power from the semiconductor device 30 to the load 31.

A third ADC 22 is connected to the first RMS converter 17 for converting an analog output signal from the first RMS converter 17 to a digital signal $P_{AV-FWD}$ representative of the average forward power from the semiconductor device 30 to the load 31.

A fourth ADC 24 is connected to the second RMS converter 19 for converting an analog output signal from the second RMS converter 19 to a digital signal $I_{DC}$ representative of the RMS current supplied to the semiconductor device 30.

A fifth ADC 25 is connected to the DC voltage sensor 11 for converting an analog output signal from the DC voltage sensor 11 to a digital signal $V_{DC}$ representative of the DC voltage supplied to the semiconductor device 30.

A sixth ADC 26 is connected to the temperature sensor 10 for converting an analog output signal from the temperature sensor 10 to a digital signal $T_{MEAS}$ representative of the measured junction temperature of the semiconductor device 30.

The computer 27 contains computer readable storage media that includes computer executable program instructions for causing the computer 27 to execute the routines (processing functions) of the computer 27 that are described herein. These instructions are stored in computer readable storage media of the computer when the computer is manufactured and/or upon being downloaded via the Internet or from portable computer readable storage media containing such instructions. The computer 27 may be embodied in a combination of physically discrete computers, with the routines described herein being executed by the combination of discrete computers.

The computer 27 processes the digital signals $P_{PK-RFL}$, $P_{PK-FWD}$, $P_{AV-FWD}$, $I_{DC}$, $V_{DC}$, $T_{MEAS}$, which are representative of the operating load conditions and the measured junction temperature of the semiconductor device 30, to manage the operation of the semiconductor device 30, as shown in more detail in FIGS. 2, 3, 4 and 5.

Figure 2:
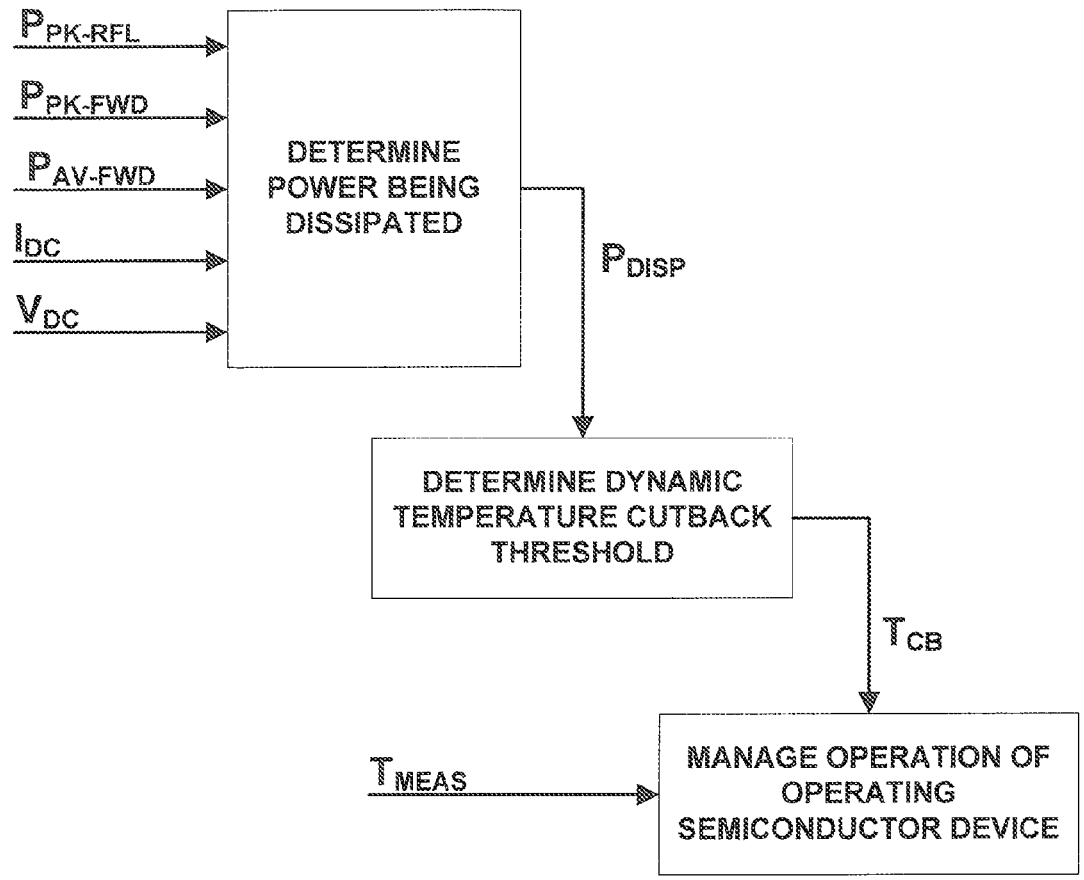
FIG. 2 is a block diagram showing the generic signal processing performed by the computer in the system of FIG. 1.

Referring to FIG. 2, the computer 27 processes the digital signals $P_{PK-RFL}$, $P_{PK-FWD}$, $P_{AV-FWD}$, $I_{DC}$, $V_{DC}$, to determine the power being dissipated $P_{DISP}$ by the operating semiconductor device 30, as shown at 34.

The computer 27 then processes a signal representative of the dissipated power $P_{DISP}$ to determine a dynamic temperature cutback threshold $T_{CB}$ for the operating semiconductor device 30, as shown at 35.

The computer 27 processes the digital signal $T_{MEAS}$ and the dynamic temperature cutback threshold $T_{CB}$ to manage the operation of the operating semiconductor device 30, as shown at 36.

Figure 3:
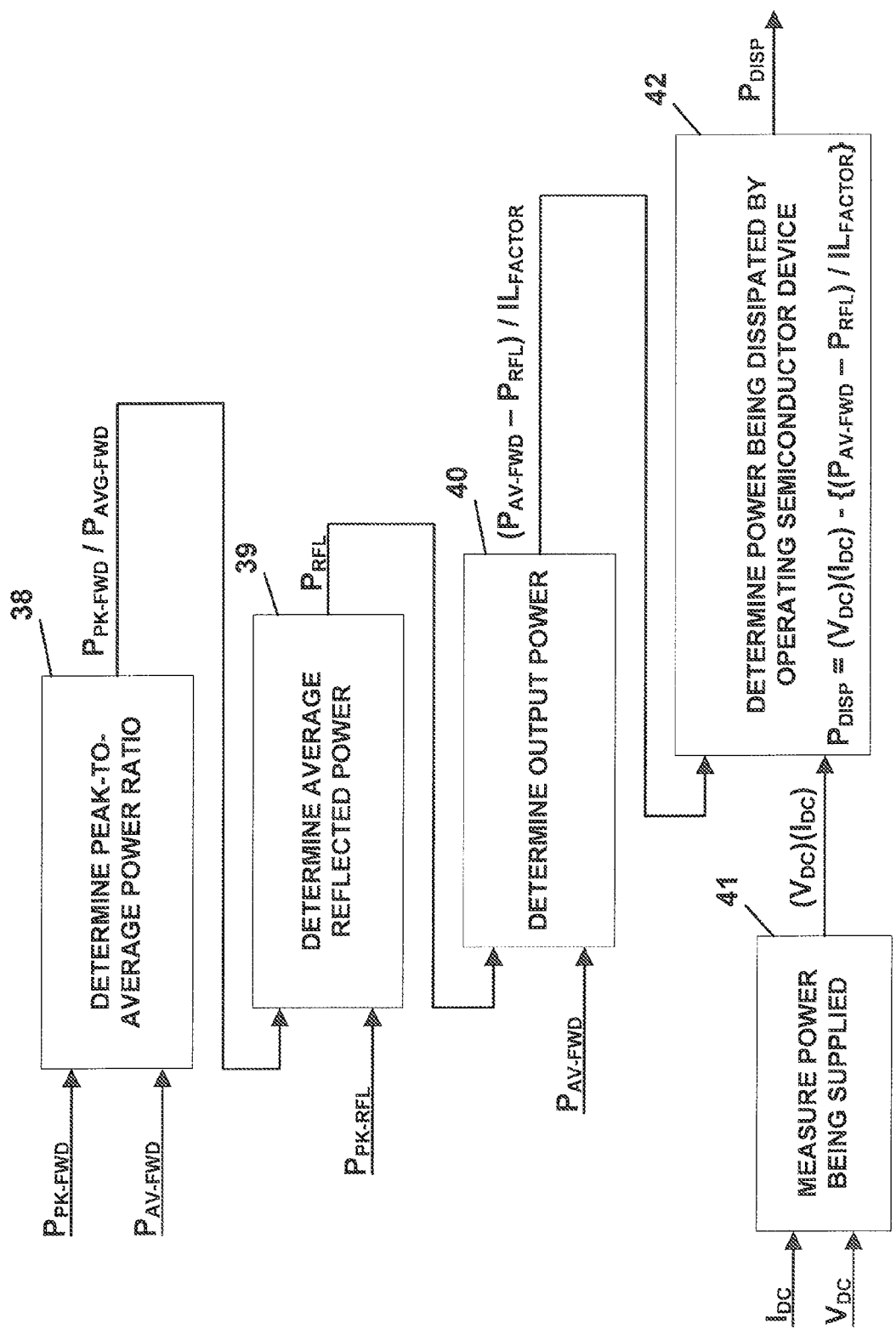
FIG. 3 is a block diagram more particularly showing the power dissipation determination step shown in FIG. 2.

Referring to FIG. 3, the computer 27 processes the digital signal $P_{PK-FWD}$ representative of the measured peak forward power from the semiconductor device 30 to the load 31 with the digital signal $P_{AV-FWD}$ representative of the measured average forward power from the semiconductor device 30 to the load 31 to determine the peak-to-average forward power ratio $(P_{PK-FWD})/(P_{AV-FWD})$, as shown at 38.

The computer 27 then processes the peak-to-average forward power ratio $(P_{PK-FWD})/(P_{AV-FWD})$ with the digital signal $P_{PK-RFL}$ representative of the peak power reflected back to the semiconductor device 30 from the load 31 to determine the average reflected power $P_{RFL}$, as shown at 39.

The computer 27 then processes the average reflected power $P_{RFL}$ with the digital signal $P_{AV-FWD}$ representative of the measured average forward power from the semiconductor device 30 to the load 31 to determine the output power $(P_{FWD}-P_{RFL})/IL_{FACTOR}$ being delivered from the semiconductor device 30, as shown at 40. $IL_{FACTOR}$ is the insertion loss from the semiconductor device 30 to the load 31.

The computer 27 processes the digital signal $I_{DC}$ representative of the RMS current being supplied to the semiconductor device 30 together with the signal $V_{DC}$ representative of the voltage being supplied to the semiconductor device 30 to measure the power $(V_{DC})/(I_{DC})$ being supplied to the semiconductor device 30, as shown at 41.

The computer 27 processes a signal $(P_{FWD}-P_{RFL})/IL_{FACTOR}$ representative of the output power being delivered from the semiconductor device with a signal $(V_{DC})/(I_{DC})$ representative of the measured power $(V_{DC})/(I_{DC})$ being supplied to the semiconductor device to determine the power being dissipated by the semiconductor device 30, in accordance with the equation, $$P_{DISP}=(V_{DC})(I_{DC})-\{(P_{FWD}-P_{RFL})/IL_{FACTOR}\} \quad [\text{Eq. 1}]$$

as shown at 42.

Figure 4:
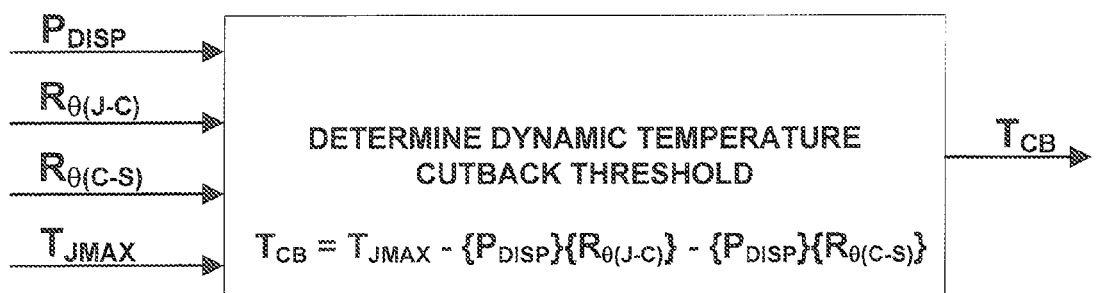
FIG. 4 is a block diagram more particularly showing the dynamic temperature cutback threshold determination step shown in FIG. 2.

Referring to FIG. 4, the computer 27 then processes a signal $P_{DISP}$ representative of the power being dissipated by the semiconductor device 30 with a signal representative of the specified thermal resistance $R_{\theta(J-C)}$ from the semiconductor junction to the case of the semiconductor device 30, a signal representative of the specified thermal resistance $R_{\theta(C-S)}$ from the case of the semiconductor device 30 to the temperature sensor 10, and a signal $T_{JMAX}$ representative of the specified maximum attainable junction temperature of the semiconductor device 30 to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\} \quad [\text{Eq. 2}]$$

This determination of the dynamic temperature cutback threshold $T_{CB}$ compensates for variations in the difference between the temperature measured by the temperature sensor 10 and the actual junction temperature that are caused by the physical separation of the junction from the temperature sensor 10, the particular temperature sensor mounting technique and variations in the power dissipation of the semiconductor device 30 under varying operating conditions, such as waveform, frequency and load variations.

This temperature difference is a function of the power currently being dissipated $P_{DISP}$ by the semiconductor device and both a thermal resistance $R_{\theta(J-C)}$ that exists between the junction of the semiconductor device 30 and the case of the semiconductor device 30 and a thermal resistance $R_{\theta(C-S)}$ that exists between the case of the semiconductor device 30 and the temperature sensor 10. As the dissipated power increases the difference between the measured junction temperature and the actual junction temperature also increases.

The thermal resistance $R_{\theta(C-S)}$ is a constant specified by the manufacturer of the semiconductor device 30.

The thermal resistance $R_{\theta(C-S)}$ is a constant specified for the particular mounting of the temperature sensor 10 in relation to the semiconductor device 30. In some embodiments the temperature sensor 10 is mounted on the semiconductor device and in other embodiments the temperature sensor 10 is mounted adjacent the case of the semiconductor device 30 on a common heatsink.

Figure 5A:
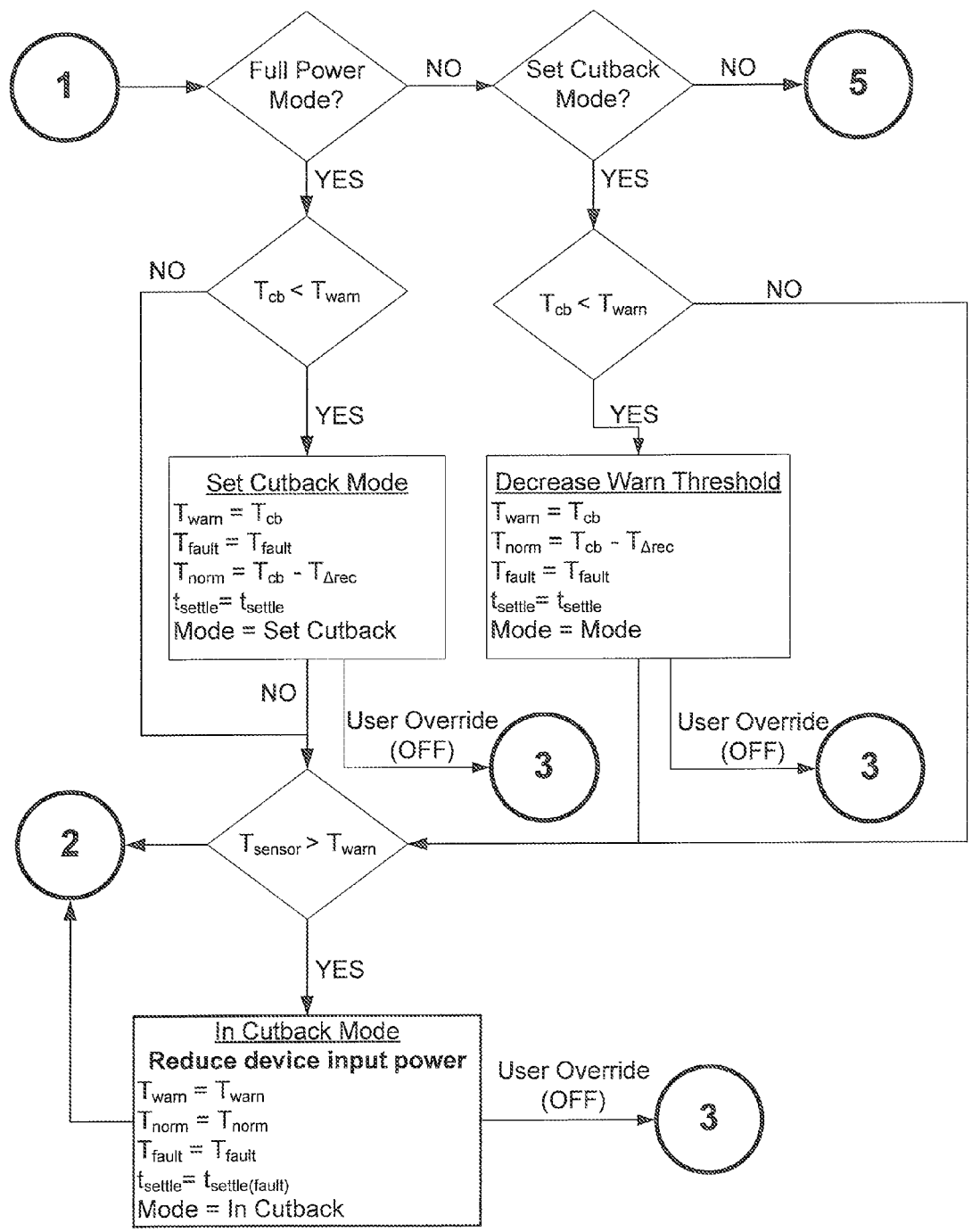
FIG. 5 is a flow diagram for the operation management step shown in FIG. 2.
Figure 5B:
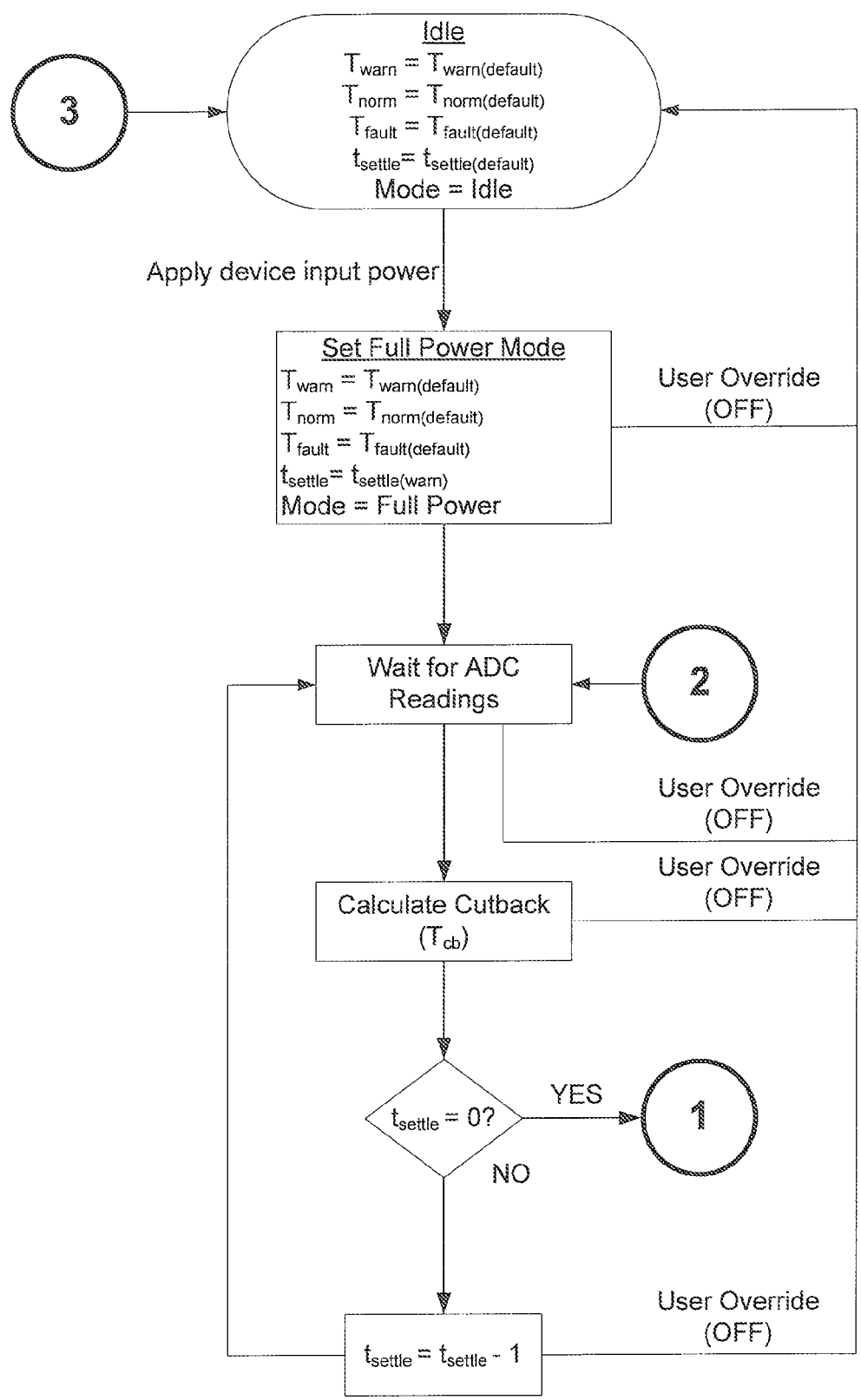
Figure 5C:
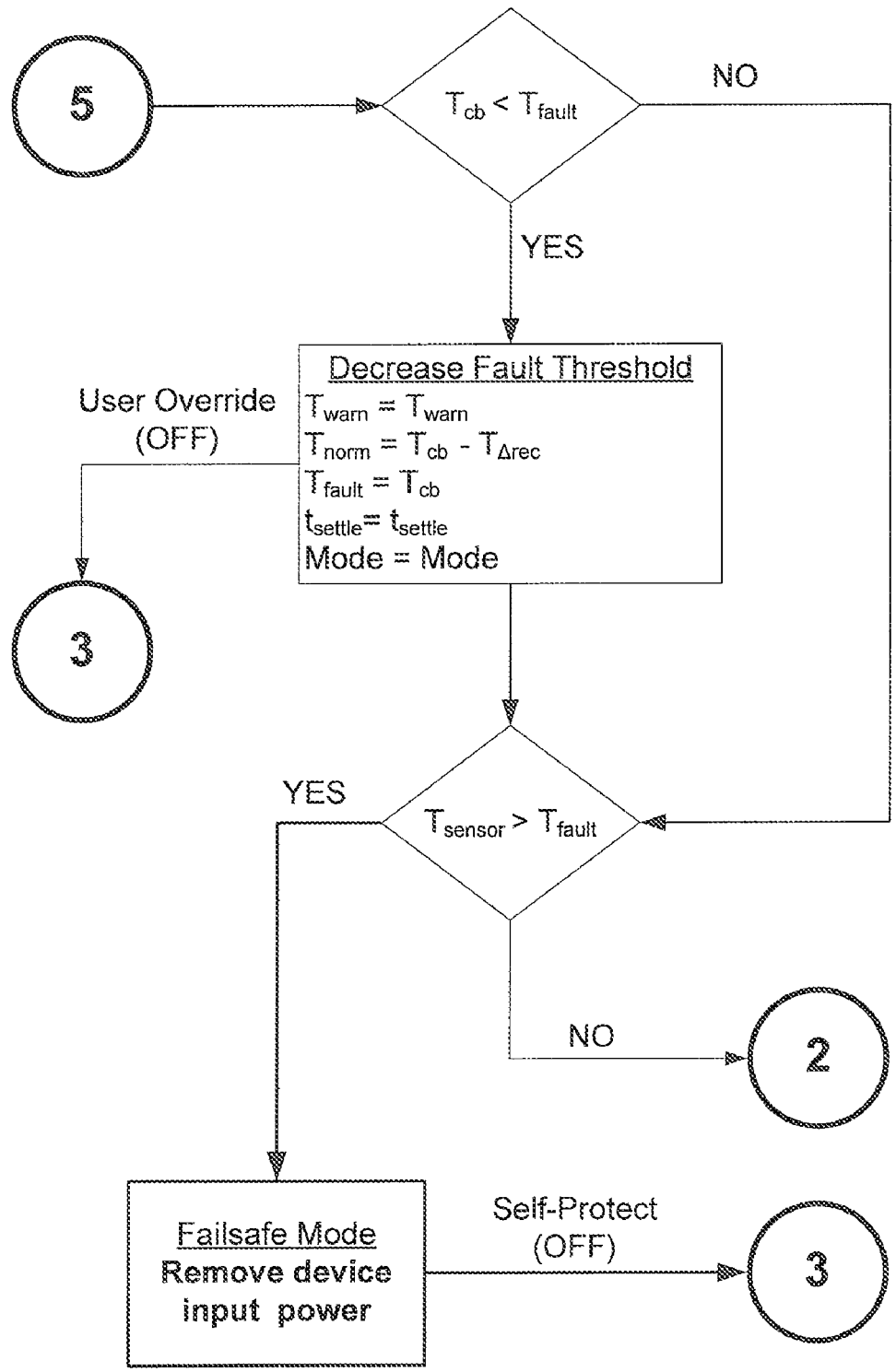

FIG. 5 is a flow diagram for management of the semiconductor operation by the computer 27 in accordance with the measured temperature $T_{MEAS}$ of the semiconductor device 30 and the dynamic temperature cutback threshold $T_{CB}$.

There are five modes of operation, as shown in the flow diagram. These modes of operation are described in a generic sense, because the semiconductor management operation described herein can be used for semiconductor devices other than those included in a power amplifier.

In the Idle mode, no power is applied to the semiconductor device 30. During this mode, measurements of the following six variables are taken as described above, but not processed by the computer 27: (1) the peak power reflected back to the semiconductor device 30 from the load 31, (2) the peak forward power from the semiconductor device 30 to the load 31, (3) the average forward power from the semiconductor device 30 to the load 31, (4) the RMS current supplied to the semiconductor device 30, (5) the DC voltage supplied to the semiconductor device 30, and (6) the junction temperature of the semiconductor device 30.

In the Full Power mode, maximum power is applied to the semiconductor device 30; measurements of the above described six variables are taken periodically; and the digital signals $P_{PK-RFL}$, $P_{PK-FWD}$, $P_{AV-FWD}$, $I_{DC}$, $T_{MEAS}$ provided by the set of ADC's 20, 21, 22, 24, 25, 26 are processed by the computer 27.

In the Set Cutback mode, maximum power is applied to the semiconductor device 30, and the dynamic temperature cutback threshold $T_{CB}$ is updated by the computer 27 in accordance with Equation 2.

In the Cutback mode, which is initiated when the measured junction temperature $T_{MEAS}$ exceeds the dynamic temperature cutback threshold $T_{CB}$, the power supplied to the semiconductor device 30 is reduced, and the dynamic temperature cutback threshold $T_{CB}$ is updated by the computer 27 in accordance with Equation 2.

In the Failsafe mode, power is not supplied to the semiconductor device 30.

With reference to the flow diagram, $T_{CB}$ is the current dynamic cutback temperature threshold; $T_{norm}$ is the temperature threshold to return to the normal Full Power mode of operation; $T_{fault}$ is the temperature threshold for cutting off the power supplied to the semiconductor device 30; $T_{\Delta rec}$ is a temperature change (decrease) required to return to the normal Full Power mode of operation; and $t_{settle}$ is the settling time allowed after a power level adjustment.

In the flow diagram, temperature thresholds are denoted by $T_{sub(default)}$, where T represents a temperature value, $_{sub}$ is the subscript defining the specific threshold, and the $_{(default)}$ field represents a qualifier that denotes an initialization value. Variables without the $_{(default)}$ qualifier represent current values instead of initialization values. For example, $T_{warn(default)}$ denotes the initialization value of the warning temperature threshold, while $T_{warn}$ denotes the current value of the warning temperature threshold. The delay value $t_{settle}$ is used to allow for a settling time after a power level is changed in order to ignore any small transients caused by the power level changing.

Referring to the flow diagram, the management operation starts running in the Idle mode. In this mode the default settings are entered for the warning $T_{warn}$, fault $T_{fault}$, and normal $T_{norm}$ temperature thresholds. At this time the settling time $t_{settle}$ is initialized as well as the mode of operation. When power is initially applied to the semiconductor device 30, the Full Power mode commences and the temperature thresholds and the settling time are reinitialized. All possible modes can return to the Idle mode by user intervention (not shown).

During the Full Power mode, the computer 27 ignores the digital signals $P_{PK-RFL}$, $P_{PK-FWD}$, $P_{AV-FWD}$, $I_{DC}$, $V_{DC}$, $T_{MEAS}$ provided by the set of ADC's until a settling time has passed $t_{settle}$. After the system has stabilized, the dynamic cutback temperature threshold $T_{CB}$ is determined in accordance with Equation 2. If the current dynamic cutback temperature threshold $T_{CB}$ is less than the warning cutback temperature $T_{warn}$, the warning cutback temperature is set to the newly calculated dynamic cutback temperature threshold $T_{CB}$. The computer 27 then determines if the measured sensor temperature $T_{MEAS}$ exceeds the warning cutback temperature $T_{warn}$. If this is the case, the power supplied to the semiconductor device 30 is reduced, and the management operation enters the Cutback mode. If the measured sensor temperature $T_{MEAS}$ has not exceeded the warning temperature the warning threshold is updated until the management operation either returns to the Idle mode or enters the In Cutback mode. It is important to note that the dynamic cutback temperature threshold $T_{CB}$ is degraded during an iteration of the management operation only when it is necessary to do so in order to prevent thermal runaway or repetitive stresses from incrementally damaging the semiconductor device 30.

Upon entering the Cutback mode the settling time is reinitialized to allow any transients from the power cutback to pass prior to beginning to update the fault threshold. The Cutback mode of management operation is similar to that of the Full Power mode, with the exception that the fault threshold $T_{fault}$ is updated with the current dynamic cutback temperature threshold $T_{CB}$. Should the measured sensor temperature $T_{MEAS}$ exceed the fault threshold, the management operation will enter the Failsafe mode in which power is removed from the semiconductor device 30 and then return to the Idle mode.

Although not shown in the flow diagram, the management operation returns to a previous Full Power mode when the normal temperature threshold ($T_{norm}$) is reached. The normal temperature threshold is based on the current dynamic cutback temperature threshold $T_{CB}$ minus an offset $T_{\Delta rec}$. Accordingly, if a transient event causes the semiconductor device 30 to dissipate such an amount of power in a short period of time as to cause a cutback, the management operation can recover should the measured junction temperature $T_{MEAS}$ decrease below the normal threshold $T_{norm}$. In this situation the management operation can begin to provide full power to the semiconductor device 30, but the lower temperature cutback threshold $T_{CB}$ is retained.

Regarding the method claims, except for those steps that can only occur in the sequence in which they are recited, and except for those steps for which the occurrence of a given sequence is specifically recited or must be inferred, the steps of the method claims do not have to occur in the sequence in which they are recited.

The benefits specifically stated herein do not necessarily apply to every conceivable embodiment of the present invention. Further, such stated benefits of the present invention are only examples and should not be construed as the only benefits of the present invention.

While the above description contains many specificities, these should not be construed as limitations on the scope of the present invention, but rather as examples of the preferred embodiments described herein. Other variations are possible and the scope of the present invention should be determined not by the embodiments described herein but rather by the claims and their legal equivalents.

The invention claimed is:

1. A method of managing the operation of a semiconductor device in accordance with varying load conditions that affect the power being dissipated by the semiconductor device, comprising the steps of:
   (a) measuring a temperature related to the junction temperature of an operating semiconductor device;
   (b) measuring the real-time operating load conditions of the operating semiconductor device;
   (c) determining the power being dissipated by the operating semiconductor device in accordance with the measured real-time operating load conditions of the semiconductor device;
   (d) determining a dynamic temperature cutback threshold for the operating semiconductor device in accordance with the determination of the power being dissipated; and
   (e) managing the operation of the semiconductor device in accordance with the measured temperature and the dynamic temperature cutback threshold.

2. A method according to claim 1, wherein step (b) comprises the steps of:
   (f) measuring the power being supplied to the semiconductor device;
   (g) measuring the forward power from the semiconductor device to a load;
   (h) measuring the power reflected back to the semiconductor device from the load; and
   wherein step (c) comprises the step of:
   (i) processing signals representative of the power ($V_{DC}$) ($I_{DC}$) being supplied to the semiconductor device, the forward power $P_{FWD}$ from the semiconductor device to a load, and the power reflected $P_{RFL}$ back to the semiconductor device from the load to determine the power being dissipated $P_{DISP}$ by the semiconductor device in accordance with:

$$P_{DISP}=(V_{DC})(I_{DC})-\{(P_{FEW}-P_{RFL})/IL_{FACTOR}\},$$

wherein $IL_{FACTOR}$ is the insertion loss factor from the semiconductor device to the load.

3. A method according to claim 2, wherein step (a) comprises the step of:
   (j) using a temperature sensor mounted on or adjacent the case of the semiconductor device to measure said temperature related to the internal junction temperature of the semiconductor device; and
   wherein step (d) comprises the step of:
   (k) processing signals representative of the power being dissipated $P_{DISP}$ by the semiconductor device, the specified thermal resistance $R_{\theta(J-C)}$ from the semiconductor junction to the case of the semiconductor device, the specified thermal resistance $R_{\theta(C-S)}$ from the case of the semiconductor device to the temperature sensor, and a specified maximum attainable junction temperature $T_{JMAX}$ of the semiconductor device to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\}.$$

4. A method according to claim 1, wherein step (a) comprises the step of:
   (f) using a temperature sensor mounted on or adjacent the case of the semiconductor device to measure said temperature related to the internal junction temperature of the semiconductor device; and
   wherein step (d) comprises the step of:
   (g) processing signals representative of the power being dissipated $P_{DISP}$ by the semiconductor device, the specified thermal resistance $R_{\theta(J-C)}$ from the semiconductor junction to the case of the semiconductor device, the specified thermal resistance $R_{\theta(C-S)}$ from the case of the semiconductor device to the temperature sensor, and a specified maximum attainable junction temperature $T_{JMAX}$ of the semiconductor device to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\}.$$

5. A system for managing the operation of a semiconductor device in accordance with varying load conditions that affect the power being dissipated by the semiconductor device, comprising:
   means for measuring a temperature related to the junction temperature of an operating semiconductor device;
   means for measuring the real-time operating load conditions of the operating semiconductor device;
   computer means adapted for determining the power being dissipated by the operating semiconductor device in accordance with the measured real-time operating load conditions of the semiconductor device;
   computer means adapted for determining a dynamic temperature cutback threshold for the operating semiconductor device in accordance with the determination of the power being dissipated; and
   computer means adapted for managing the operation of the semiconductor device in accordance with the measured temperature and the dynamic temperature cutback threshold.

6. A system according to claim 5, wherein the means for measuring said operating conditions comprises:
   means for measuring the power being supplied to the semiconductor device;
   means for measuring the forward power from the semiconductor device to a load;
   means for measuring the power reflected back to the semiconductor device from the load; and
   wherein the computer that is adapted for determining the power being dissipated is adapted for processing signals representative of the power ($V_{DC}$)($I_{DC}$) being supplied to the semiconductor device, the forward power $P_{FWD}$ from the semiconductor device to a load, and the power reflected $P_{RFL}$ back to the semiconductor device from the load to determine the power being dissipated $P_{DISP}$ by the semiconductor device in accordance with:

$$P_{DISP}=(V_{DC})(I_{DC})-\{(P_{FWD}-P_{RFL})/IL_{FACTOR}\},$$

wherein $IL_{FACTOR}$ is the insertion loss factor from the semiconductor device to the load.

7. A system according to claim 5, wherein the means for measuring said temperature related to the internal junction temperature of the semiconductor device comprises a temperature sensor disposed on or adjacent the case of the semiconductor device; and
   wherein the computer that is adapted for determining a dynamic temperature cutback threshold is adapted for processing signals representative of the power being dissipated $P_{DISP}$ by the semiconductor device, the specified thermal resistance $R_{\theta(J-C)}$ from the semiconductor junction to the case of the semiconductor device, the specified thermal resistance $R_{\theta(C-S)}$ from the case of the semiconductor device to the temperature sensor, and a specified maximum attainable junction temperature $T_{JMAX}$ of the semiconductor device to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\}.$$

8. A system according to claim 5, wherein the means for measuring said temperature related to the internal junction temperature of the semiconductor device comprises a temperature sensor disposed on or adjacent the case of the semiconductor device; and wherein the computer that is adapted for determining a dynamic temperature cutback threshold is adapted for processing signals representative of the power being dissipated $P_{DISP}$ by the semiconductor device, the specified thermal resistance $R_{\theta(J-C)}$ from the semiconductor junction to the case of the semiconductor device, the specified thermal resistance $R_{\theta(C-S)}$ from the case of the semiconductor device to the temperature sensor, and a specified maximum attainable junction temperature $T_{JMAX}$ of the semiconductor device to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\}.$$

9. A non-transitory computer readable storage medium for use with a computer in a system for managing the operation of a semiconductor device in accordance with varying load conditions that affect the power being dissipated by the semiconductor device; said system comprising: means for measuring a temperature related to the junction temperature of an operating semiconductor device; means for measuring the real-time operating load conditions of the operating semiconductor device; and said computer, wherein the computer readable storage medium contains computer executable program instructions for causing the computer to perform the steps of:

(a) determining the power being dissipated by the operating semiconductor device in accordance with the measured real-time operating load conditions of the semiconductor device;

(b) determining a dynamic temperature cutback threshold for the operating semiconductor device in accordance with the determination of the power being dissipated; and (c) managing the operation of the semiconductor device in accordance with the measured temperature and the dynamic temperature cutback threshold.

10. A non-transitory computer readable storage medium according to claim 9, wherein the means for measuring the real-time operating load conditions of the operating semiconductor device is adapted for measuring the power being supplied to the semiconductor device, the forward power from the semiconductor device to a load; and the power reflected back to the semiconductor device from the load; and wherein the computer readable storage medium contains computer executable program instructions for causing the computer to perform step (a) by processing signals representative of the power $(V_{DC})(I_{DC})$ being supplied to the semiconductor device, the forward power $P_{FWD}$ from the semiconductor device to a load, and the power reflected $P_{RFL}$ back to the semiconductor device from the load to determine the power being dissipated $P_{DISP}$ by the semiconductor device in accordance with:

$$P_{DISP}=(V_{DC})(I_{DC})-\{(P_{FWD}-P_{RFL})/IL_{FACTOR}\},$$

wherein $IL_{FACTOR}$ is the insertion loss factor from the semiconductor device to the load.

11. A non-transitory computer readable storage medium according to claim 10, wherein the temperature related to the internal junction temperature of the semiconductor device is measured by using a temperature sensor mounted on or adjacent the case of the semiconductor device; and wherein the computer readable storage medium contains computer executable program instructions for causing the computer to perform step (b) by processing signals representative of the power being dissipated $P_{DISP}$ by the semiconductor device, the specified thermal resistance $R_{\theta(J-C)}$ from the semiconductor junction to the case of the semiconductor device, the specified thermal resistance $R_{\theta(C-S)}$ from the case of the semiconductor device to the temperature sensor, and a specified maximum attainable junction temperature $T_{JMAX}$ of the semiconductor device to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\}.$$

12. A non-transitory computer readable storage medium according to claim 9, wherein the temperature related to the internal junction temperature of the semiconductor device is measured by using a temperature sensor mounted on or adjacent the case of the semiconductor device; and wherein the computer readable storage medium contains computer executable program instructions for causing the computer to perform step (b) by processing signals representative of the power being dissipated $P_{DISP}$ by the semiconductor device, the specified thermal resistance $R_{\theta(J-C)}$ from the semiconductor junction to the case of the semiconductor device, the specified thermal resistance $R_{\theta(C-S)}$ from the case of the semiconductor device to the temperature sensor, and a specified maximum attainable junction temperature $T_{JMAX}$ of the semiconductor device to determine the dynamic temperature cutback threshold $T_{CB}$ in accordance with:

$$T_{CB}=T_{JMAX}-\{P_{DISP}\}\{R_{\theta(J-C)}\}-\{P_{DISP}\}\{R_{\theta(C-S)}\}.$$

* * * * *

UNITED STATES PATENT AND TRADEMARK OFFICE
CERTIFICATE OF CORRECTION

PATENT NO. : 8,260,473 B1
APPLICATION NO. : 12/758225
DATED : September 4, 2012
INVENTOR(S) : Thomas Daniel O'Brien et al.

It is certified that error appears in the above-identified patent and that said Letters Patent is hereby corrected as shown below:

Column 4, line 66, "$R_{\Theta (C-S)}$" should be --$R_{\Theta (J-C)}$--
Column 5, line 31, insert --$V_{DC}$.-- after --$I_{DC}$,--
Column 7, line 42, "$P_{FEW}$" should be --$P_{FWD}$--
Column 7, line 62, insert --$\{P_{DISP}\}$-- before --$\{R_{\Theta (C-S)}\}$--

Signed and Sealed this
Twenty-second Day of January, 2013

David J. Kappos
*Director of the United States Patent and Trademark Office*